US008797205B2

(12) United States Patent
Furuta et al.

(10) Patent No.: US 8,797,205 B2
(45) Date of Patent: Aug. 5, 2014

(54) A/D CONVERSION DEVICE AND RADIO DEVICE

(75) Inventors: Masanori Furuta, Kanagawa-ken (JP); Tetsuro Itakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 147 days.

(21) Appl. No.: 13/413,793

(22) Filed: Mar. 7, 2012

(65) Prior Publication Data

US 2012/0169520 A1 Jul. 5, 2012

Related U.S. Application Data

(63) Continuation of application No. PCT/JP2009/004788, filed on Sep. 24, 2009.

(51) Int. Cl.
*H03M 1/12* (2006.01)

(52) U.S. Cl.
USPC .......................................... 341/172; 341/155

(58) Field of Classification Search
USPC .................. 341/120, 172, 155, 156, 122, 126
See application file for complete search history.

(56) References Cited

U.S. PATENT DOCUMENTS

| | | | | |
|---|---|---|---|---|
| 6,320,530 | B1 | 11/2001 | Horie | |
| 6,914,550 | B2 * | 7/2005 | Cai | 341/155 |
| 7,015,841 | B2 * | 3/2006 | Yoshida et al. | 341/120 |
| 2005/0068220 | A1 | 3/2005 | Wada et al. | |
| 2006/0012506 | A1 | 1/2006 | Wada et al. | |
| 2010/0142653 | A1 | 6/2010 | Furuta et al. | |

FOREIGN PATENT DOCUMENTS

| | | |
|---|---|---|
| DE | 100 27 349 A1 | 1/2001 |
| JP | 2001-053610 | 2/2001 |
| JP | 2005-109747 | 4/2005 |
| JP | 2009-164914 | 7/2009 |

OTHER PUBLICATIONS

International Preliminary Report on Patentability for International Application No. PCT/JP2009/004788 issued on Apr. 11, 2012.

Written Opinion for International Application No. PCT/JP2009/004788.

International Search Report for International Application No. PCT/JP2009/004788 mailed on Nov. 2, 2009.

Louwsma, Simon M., et al.; "A 1.35 GS/10b, 175 mW Time-Interleaved AD Converter in 0.13 CMOS", IEEE 2007 Symposium on VLSI Circuits Digest of Technical Papers, pp. 62-63.

Li, Jinghua, et al.; "Pipeline of Successive Approximation Converters With Optimum Power Merit Factor", IEEE, 2002, pp. 17-20.

* cited by examiner

*Primary Examiner* — Joseph Lauture
(74) *Attorney, Agent, or Firm* — Amin, Turocy & Watson, LLP

(57) ABSTRACT

This A/D convertor includes: a first D/A conversion unit configured to sample an analog input signal, and to generate a first difference signal by performing successive comparison of the analog input signal based on a reference voltage; a precharge capacitor unit configured to hold the reference voltage; a first comparing unit configured to compare the first difference signal with a reference value to generate a first digital signal; and an amplifying unit configured to calculate by using the first difference signal and the reference voltage to generate a residual signal.

10 Claims, 8 Drawing Sheets

11,12,13
$SW_{DAC1}$ $C_{DAC1}$
C/2 C/4 C/8 C/8 C/8 C/8 C/4 C/2
$V_{inp}$ $V_{rp}$ $V_{rm}$ $V_{inm}$ $SW_{X1}$ $V_{com}$
$V_{op}$ $V_{om}$ $SW_{X2}$ $SW_{X3}$
16,17 $C_{pre1a}$ $SW_{pre1a}$ $SW_{Y1b}$ $SW_{Y2b}$ $C_{pre1b}$ $SW_{pre1b}$
$SW_{Y1a}$ $SW_{Y2a}$ 18b
$C_{pre2a}$ $SW_{pre2a}$ $C_{pre2b}$ $SW_{pre2b}$
15 14 SWITCH CONTROL UNIT
$D_{out1}$
$SW_{Xn}$
10b V_r
0
SW_2
25
SWITCH CONTROL UNIT
D_out2
D_out1
24
CAPACITIVE DAC
22
20
23
21
S/H
1
18
16
PRECHARGE CAPACITORS
V_r
17
0
SW_1
15
SWITCH CONTROL UNIT
14
CAPACITIVE DAC
12
10
13
11
S/H
A_in
CLK

SAMPLE PHASE

HOLD PHASE

COMPARISON PHASE

RESIDUAL SIGNAL AMPLIFICATION PHASE $V_{op}$
$V_{om}$
$V_{rp}$
$V_{rm}$
18
16,17
$SW_{pre1b}$
$C_{pre1b}$
$SW_{pre2b}$
$C_{pre2b}$
$SW_{pre1a}$
$C_{pre1a}$
$SW_{pre2a}$
$C_{pre2a}$
C/2
C/4
C/8
$SW_{X2}$
$SW_{X3}$
$SW_{Xn}$
10a
11,12,13
$SW_{DAC1}$
$C_{DAC1}$
$SW_{DAC2}$
$C_{DAC2}$
$SW_{1a}$
$SW_{1b}$
$V_{com}$
14
15
SWITCH CONTROL UNIT
$D_{out1}$
$V_{inp}$
$V_{inm}$
$SW_{X1}$
I
II 10b
18b
14
15
SWITCH CONTROL UNIT
11,12,13
16,17
$SW_{DAC1}$
$C_{DAC1}$
C/2
C/4
C/8
C/8
C/8
C/8
C/4
C/2
$V_{inp}$
$V_{inm}$
$V_{com}$
$SW_{X1}$
$SW_{X2}$
$SW_{X3}$
$SW_{Xn}$
$V_{rp}$
$V_{rm}$
$V_{op}$
$V_{om}$
$C_{pre1a}$
$C_{pre2a}$
$C_{pre1b}$
$C_{pre2b}$
$SW_{pre1a}$
$SW_{pre2a}$
$SW_{pre1b}$
$SW_{pre2b}$
$SW_{Y1a}$
$SW_{Y2a}$
$SW_{Y1b}$
$SW_{Y2b}$
$D_{out1}$ $V_r$
120
0
$SW_2$
SWITCH CONTROL UNIT
25
CAPACITIVE DAC
122
24
23
21
S/H
$D_{out2}$
$D_{out1}$
110
11
13
CAPACITIVE DAC
112
14
SWITCH CONTROL UNIT
115
$SW_1$
0
17
PRECHARGE CAPACITORS
116
$SW_3$
$SW_4$
118
2
CLK
$A_{in}$

A/D CONVERSION DEVICE AND RADIO DEVICE

CROSS-REFERENCE TO RELATED APPLICATION

This application is a continuation of prior International Application No. PCT/JP2009/004788 filed on Sep. 24, 2009; the entire contents of all of which are incorporated herein by reference.

FIELD

Embodiments described herein relate to a signal processing technique, and particularly relates to an A/D conversion device (ADC).

BACKGROUND

In a successive approximation type A/D conversion device (SARADC: Successive Approximation Routine Analog-to-Digital Converter) using a capacitive D/A converter (capacitive DAC), A/D conversion is performed by using a plurality of capacitors, switches that switch a connection relation of the capacitors and a comparator. Each of the plurality of capacitors in the SARADC has a binary-weighted capacitance value, and to each of the capacitors, a reference voltage source, a ground and the like are connected via a changeover switch. Specifically, A/D conversion is realized by redistributing charge accumulated in each of the plurality of capacitors.

As an application of the SARADC, there has been proposed a pipelined SARADC in which combinations of a plurality of SARADCs and basic arithmetic circuits are connected in cascade and in multistage, and are operated in a pipeline manner.

In the SARADC that requires basic calculation processing, there is a need to make a settling error of a reference voltage to be close to zero as much as possible for reducing a calculation error. The settling error depends on a settling time of a reference voltage driving circuit, and for reducing the settling time, a large drive current was required. This requires an amplifier that supplies the large drive current, and thus was a cause of enlarging a circuit scale. Further, this was also a part of the reason of increasing power consumption.

Embodiments described herein were made to solve such problems, and an object thereof is to provide an A/D conversion device and a radio device capable of reducing power consumption and reducing a circuit scale.

In order to achieve the above-described object, an A/D conversion device according to one aspect of the embodiments includes: a D/A conversion unit sampling an analog input signal, generating a comparison signal for successive comparison with the analog input signal by using a reference signal, and generating a difference signal between the analog input signal and the comparison signal; a precharge capacitor unit holding the reference signal; a comparing unit comparing the comparison signal with a reference value to generate a digital signal; and an amplifying unit calculating by using the difference signal and the reference signal to generate a residual signal.

According to the embodiments, it is possible to reduce power consumption and to reduce a circuit scale of an A/D conversion device and a radio device.

DETAILED DESCRIPTION

First Embodiment

Figure 1:
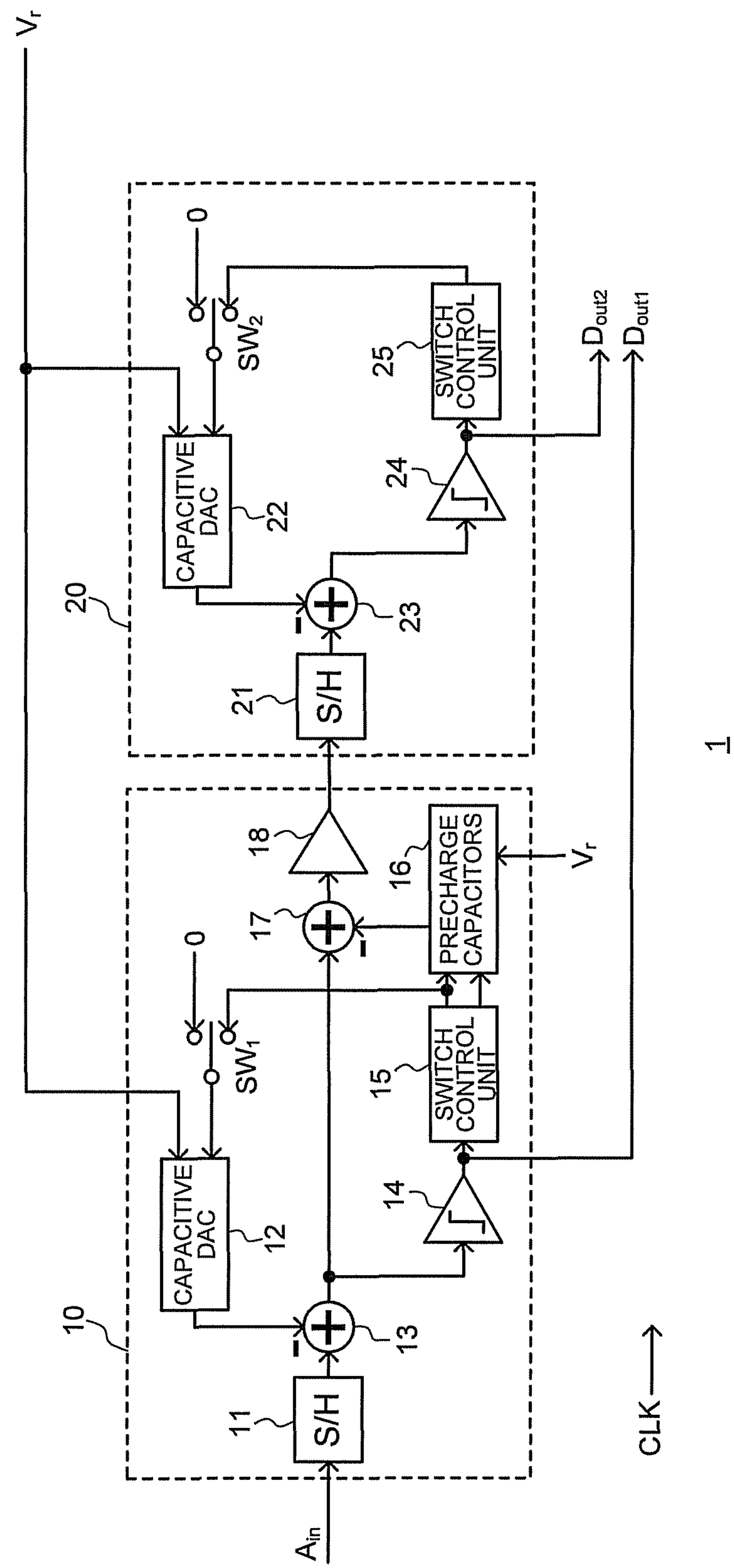
FIG. 1 is a diagram showing an A/D conversion device according to a first embodiment.
Figure 2:
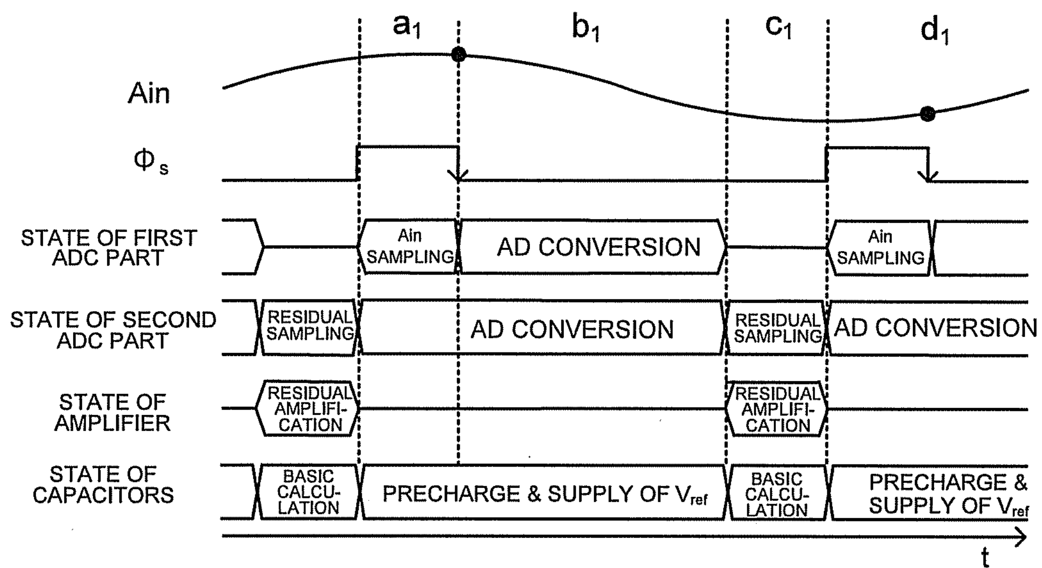
FIG. 2 is a diagram showing an operation of the A/D conversion device of the first embodiment.
Figure 3:
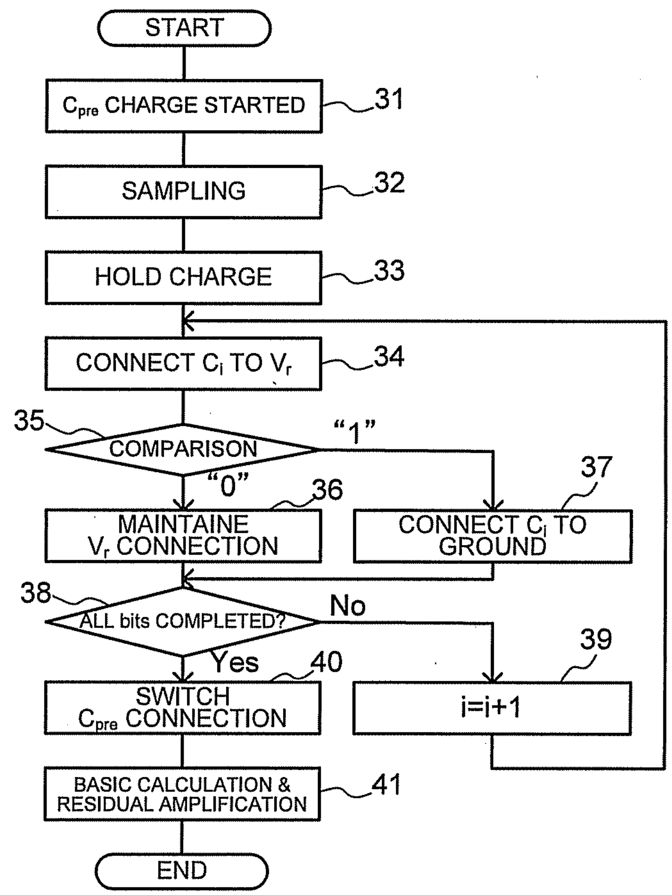
FIG. 3 is a flow chart showing an operation of the A/D conversion device of the first embodiment.

Hereinafter, one embodiment will be described in detail with reference to the drawings. As shown in FIG. 1, an A/D conversion device 1 (ADC 1) of this embodiment forms a pipelined SARADC having a first ADC 10 and a second ADC 20. The first ADC 10 performs coarse A/D conversion process on an input analog signal $A_{in}$ to generate a digital signal corresponding to a high-order bit. The second ADC 20 corresponds to the first ADC 10, and performs fine A/D conversion process on a residual signal output from the first ADC 10 to generate a digital signal corresponding to a low-order bit.

The first ADC 10 has a sample-and-hold circuit 11 (S/H 11), a capacitive DAC 12, subtracters 13 and 17, a comparator 14, a switch control unit 15, precharge capacitors 16 ($C_{pre}$ 16), an amplifier 18 (AMP 18) and a switch $SW_1$. The second ADC 20 has substantially the same structure as that of the first ADC 10, and has a sample-and-hold circuit 21 (S/H 21), a capacitive DAC 22, a subtracter 23, a comparator 24, a switch control unit 25 and a switch $SW_2$.

The sample-and-hold circuit 11 (S/H 11) samples the input analog signal $A_{in}$ and holds a potential of the signal until successive comparison A/D conversion is started. The capacitive DAC 12 includes a plurality of capacitors each having a binary-weighted capacitance value, and switches for connecting a reference voltage source $V_r$, a ground GND (reference potential) and the like to each of the capacitors, and performs charge distribution process for successive comparison. Note that the capacitive DAC 12 may also be structured to have both functions of the capacitive DAC 12 and the S/H 11. In this case, it is possible to reduce a circuit area required for the S/H 11.

The subtracter 13 subtracts a potential to be successively compared (comparison voltage) from the potential held in the S/H 11. The comparator 14 compares a result of subtraction obtained by the subtracter 13 with a ground level (reference potential) to realize A/D conversion. The switch control unit 15 includes a logic section that generates a control signal required for the calculation in the SARADC, and a buffer that temporarily stores an A/D conversion value obtained by the comparator 14. The switch control unit 15 has a function to generate a control signal for switching a combination of capacitors in the A/D conversion of the capacitive DAC 12 and to send the signal to the capacitive DAC 12. The pre-charge capacitors 16 ($C_{pre}$ 16) charge a reference voltage used for the basic calculation (residual amplification) in the A/D conversion, and supply a potential based on an instruction from the switch control unit 15. The subtracter 17 subtracts the potential of the reference voltage charged in the $C_{pre}$ 16 from an output of the subtracter 13, and sends an obtained residual signal to the AMP 18. The switch $SW_1$ switches the comparison voltage during the basic calculation to either the reference voltage or the ground level.

The second ADC 20 has substantially the same structure as that of the first ADC 10, and has the sample-and-hold circuit 21 (S/H 21), the capacitive DAC 22, the subtracter 23, the comparator 24, the switch control unit 25 and the switch $SW_2$. The sample-and-hold circuit 21 (S/H 21), the capacitive DAC 22, the subtracter 23, the comparator 24, the switch control unit 25 and the switch $SW_2$ have similar structure and function to those of the S/H 11, the capacitive DAC 12, the subtracter 13, the comparator 14, the switch control unit 15 and the switch $SW_1$ of the first ADC 10. Since there exists no ADC at a rear stage of the second ADC 20 of this embodiment, the second ADC 20 does not have to conduct basic calculation. For this reason, the second ADC 20 does not have an amplifier, a subtracter and precharge capacitors, compared with the first ADC 10.

(Operation of First Embodiment)

Next, with reference to FIG. 1 to FIG. 4, an operation of the ADC 1 of this embodiment will be described. Operation states of the respective circuit elements of the ADC 1 of this embodiment can be roughly divided into three. Specifically, they are a sample phase by the first ADC 10 indicated by $a_1$ in FIG. 2, an A/D conversion phase by the first ADC 10 indicated by $b_1$ in FIG. 2, and a residual amplification phase (basic calculation phase) by the AMP 18 indicated by $c_1$ in FIG. 2 and an A/D conversion phase by the second ADC 20 indicated by $d_1$. Hereinafter, explanation will be made on the assumption that the capacitive DAC 12 has both functions of the capacitive DAC 12 and the S/H 11.

Figure 4A:
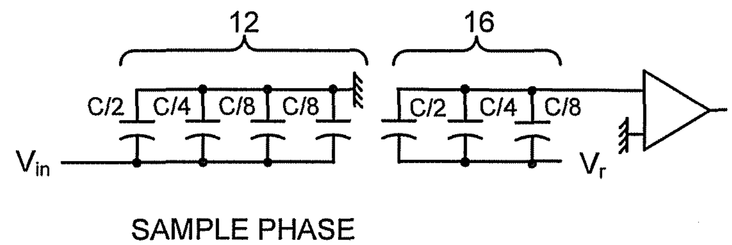
FIG. 4A is a diagram showing a sample phase in the A/D conversion device of the first embodiment.

First, as shown in FIG. 4A, the switch control unit 15 switches a connection of the $C_{pre}$ 16 and capacitors of the capacitive DAC 12 to make the $C_{pre}$ 16 charge the reference voltage (step 31, which is referred to as "S31", hereinafter), and to make the S/H 11 sample an input signal $A_{in}$, (S32). Concretely, the switch control unit connects one ends of the $C_{pre}$ 16 to an input of the AMP 18, and connects the other ends of the $C_{pre}$ 16 to a reference voltage $V_r$. Further, the switch control unit 15 connects one sides of the capacitors of the capacitive DAC 12 as the S/H 11 to the ground, and connects the other sides of the capacitors to an input signal (voltage $V_{in}$). At this time, if a total capacitance of the capacitors is set as C, and charge accumulated in the capacitors is set as Q, a relation represented by a mathematical expression 1 is satisfied.

$$Q=CV_{in} \quad \text{[Mathematical Expression 1]}$$

Figure 4B:
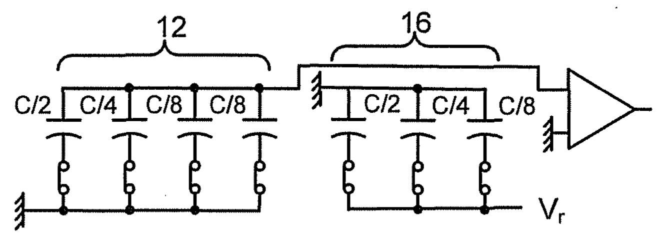
FIG. 4B is a diagram showing a hold phase in the A/D conversion device of the first embodiment.

Next, as shown in FIG. 4B, the switch control unit 15 switches a polarity of the capacitor after sampling the voltage of the input signal, and holds the sampled signal until the successive comparison A/D conversion is started (S33). Specifically, all of upper terminals of the capacitors connected to the ground are disconnected from the ground and are connected to the input of the AMP 18, and lower terminals of the capacitors are connected to the ground. As a result of this, a potential on the side of the upper terminals of the capacitors of the capacitive DAC 12 shifts by $-V_{in}$. Note that the switch control unit 15 disconnects the one ends of the $C_{pre}$ 16 from the input of the AMP 18 and connects them to the ground, thereby keeping the charging state as it is.

Figure 4C:
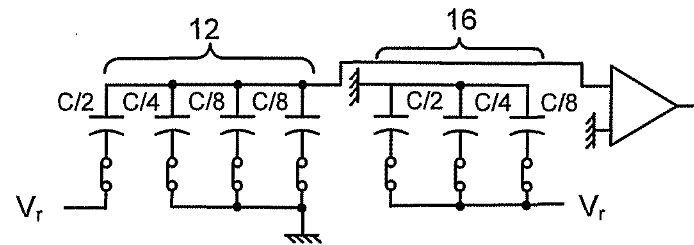
FIG. 4C is a diagram showing a comparison phase in the A/D conversion device of the first embodiment.

Followed by a hold phase shown in FIG. 4B, the switch control unit 15 connects the reference voltage to the lower terminal of the capacitor having the largest capacitance value (for example, $C_0$=C/2), out of the capacitors included in the capacitive DAC 12 (S34). This state is shown in FIG. 4C. Through this operation, the capacitive DAC 12 obtains a comparison voltage achieved by dividing the reference voltage by a power of 2, and gives a difference between the voltage of the input signal and the comparison voltage to the comparator 14.

The comparator 14 compares the given difference value with the ground level to perform the A/D conversion. At this time, when the obtained digital bit is "0", the connection of reference voltage $V_r$ is maintained (S36), and the switch control unit 15 connects the reference voltage to the lower terminal of the capacitor with the second largest capacitance value. When the obtained digital bit is "1", the terminal of the capacitor connected to the reference voltage is connected to the ground (S37).

As above, the successive comparison A/D conversion is realized by the capacitors of the capacitive DAC 12, the comparator and the switch control unit 15 (SAR logic). When N-bit A/D conversion is performed (S38), the switch control unit 15 switches the capacitors of the capacitive DAC 12 so as to repeatedly perform the series of operations N times from the most significant bit to the least significant bit (for example, $C_1$ (i=0 to N)) (S39, S34 to S38).

When the successive comparison A/D conversion ends (Yes in S38), the switch control unit 15 controls the precharge capacitors based on a result of the A/D conversion (S40) to perform basic calculation. During the basic calculation, since the comparison voltage is set to 0, control terminals (bottom plates) of the capacitors of the capacitive DAC 12 are set to ground level. In addition, the switch control unit 15 disconnects the one ends of the $C_{pre}$ 16 from the ground to connect them to the input of the AMP 18, and disconnects the other ends of the $C_{pre}$ 16 from the reference potential $V_r$ to connect them to the ground.

Figure 4D:
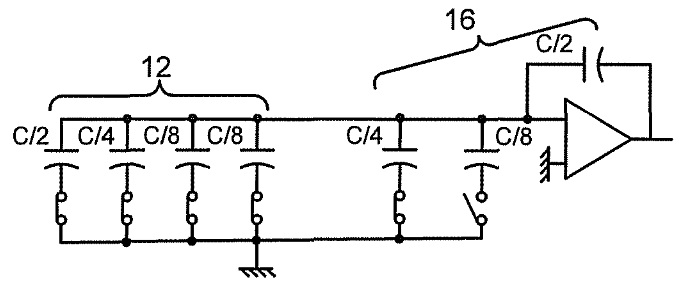
FIG. 4D is a diagram showing a residual signal amplification phase in the A/D conversion device of the first embodiment.

The AMP 18 amplifies a residual signal obtained by the basic calculation, and sends the resultant to the S/H 21 of the second ADC 20 of the subsequent stage (S41). FIG. 4D shows a state of amplifying the residual signal. Basic operations in the second ADC 20 are the same as the operations in steps 31 to 40 in the first ADC, but, since there exists no ADC at the rear stage of the second ADC 20, there is no need to perform the basic calculation and the amplification.

As above, in the ADC 1 of this embodiment, the charge of the reference voltage used in the basic calculation is previously accumulated in the precharge capacitors in the sample phase, the hold phase and the comparison phase. A period of time required for accumulating the charge in the precharge capacitors is longer than a period of time required for the basic calculation, so that compared with a case where all of the charges of the reference voltage are accumulated in the capacitors during the basic calculation, it is possible to reduce power consumption of the entire ADC 1.

Example 1

Next, with reference to FIG. 5, an example of a first ADC in the ADC 1 of this embodiment will be described. The first ADC and a second ADC of the ADC 1 have substantially the common structure and function, so that, as a representative, an example of the first ADC will be described here.

A first ADC 10*a* of this example has a function as a 3-bit SARADC, and processes operation signals formed of a non-inverted signal and an inverted signal. Specifically, the first ADC 10*a* includes a non-inverted signal processing circuit and an inverted signal processing circuit.

The non-inverted signal processing circuit ("I" in FIG. 5, which is referred to as "circuit I", hereinafter) has capacitors $C_{DAC1}$ and switches $SW_{DAC1}$ which function as the S/H 11, the capacitive DAC 12 and the subtracter 13, the comparator 14, the switch control unit 15, capacitors $C_{pre1a}$ and $C_{pre1b}$ as well as switches $SW_{pre1a}$ and $SW_{pre1b}$ which function as the $C_{pre}$ 16 and the subtracter 17, the AMP 18, and a switch $SW_{1a}$. The inverted signal processing circuit ("II" in FIG. 5, which is referred to as "circuit II", hereinafter) has capacitors $C_{DAC2}$ and switches $SW_{DAC2}$ which function as the S/H 11, the capacitive DAC 12 and the subtracter 13, the comparator 14, the switch control unit 15, capacitors $C_{pre2a}$ and $C_{pre2b}$ as well as switches $SW_{pre2a}$ and $SW_{pre2b}$ which function as the $C_{pre}$ 16 and the subtracter 17, the AMP 18, and a switch $SW_{1b}$.

An input $V_{inp}$ is input into the circuit I, and the circuit I uses a reference voltage $V_{rp}$ to output a $V_{op}$. Further, an input $V_{inm}$ is input into the circuit II, and the circuit II uses a reference voltage $V_{rm}$ to output a $V_{om}$. Both of the circuits have the common elements and are symmetrical to each other and have the common function, so that in the description hereinbelow, the circuit I will be described as a representative.

The capacitors $C_{DAC1}$ include two capacitors each having a capacitance value of C/8, one capacitor having a capacitance value of C/4, and one capacitor having a capacitance value of C/2, based on a capacitance value C as a reference. Here, a magnitude relation among the capacitance values is C/2>C/4>C/8. One ends (upper ends) of these four capacitors are connected to one another, and the other ends (bottom plates) thereof are connected to the switches $SW_{DAC1}$. The switches $SW_{DAC1}$ connect, based on a control signal from the switch control unit 15, the bottom plates of the four capacitors that form the capacitors $C_{DAC1}$ to one of the reference voltage ($V_{rp}$, or $V_{rm}$), the input voltage $V_{inp}$, and a reference potential $V_{com}$ (ground potential).

The comparator 14 compares potential of the upper ends of the four capacitors that form the capacitors $C_{DAC1}$ with the reference potential $V_{com}$ to perform A/D conversion.

The capacitors $C_{pre1a}$ include one capacitor having a capacitance value of C/8, and one capacitor having a capacitance value of C/4, based on the capacitance value C as a reference. To both ends of these two capacitors, the switches $SW_{pre1a}$ are connected. The $SW_{pre1a}$ connect, based on a control signal from the switch control unit 15, one ends (upper ends) of the two capacitors that form the capacitors $C_{pre1a}$ to either the upper ends of the capacitors $C_{DAC1}$ or the reference potential $V_{com}$, and connect the other ends (bottom plates) of the capacitors to either the reference voltage ($V_{rp}$ or $V_{rm}$) or the reference potential $V_{com}$.

The capacitor $C_{pre1b}$ is formed of one capacitor having a capacitance value of C/2, based on the capacitance value C as a reference. One end (upper end) of the capacitor $C_{pre1b}$ is connected to the input of the AMP 18, and the other end (bottom plate) of the capacitor is connected to the switches $SW_{pre1b}$. The switches $SW_{pre1b}$ connect, based on a control signal from the switch control unit 15, the bottom plate of the capacitor $C_{pre1b}$ to either the reference voltage $V_{rp}$ or an output of the AMP 18. In addition, the switches $SW_{pre1b}$ short-circuit both ends of the capacitor $C_{pre1b}$ based on a control signal from the switch control unit 15.

Mutual connection and disconnection of the reference voltages to be connected to the switches $SW_{DAC1}$ and the capacitors $C_{pre1a}$ are conducted by $SW_{x1}$ and $SW_{x2}$ ($SW_{x3}$), based on a control signal of the switch control unit 15.

(Operation of Example 1)

Here, with reference to FIG. 2, FIG. 5 and FIGS. 6A to 6C, an operation of the first ADC 10*a* of the example 1 shown in FIG. 5 will be described.

Figure 6A:
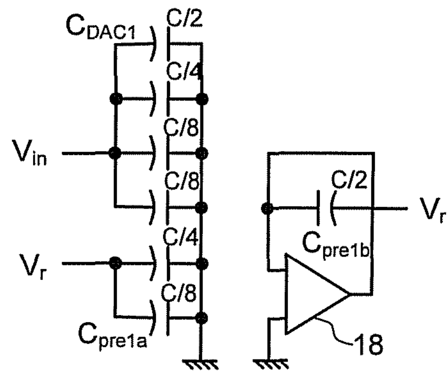
FIG. 6A is a diagram showing a sample phase in the A/D conversion device shown in FIG. 5.

First, the operation state of the first ADC 10*a* becomes the sample phase in which the input signal $A_{in}$, is sampled. At this time, the switch control unit 15 controls the switches $SW_{DAC1}$ and $SW_{1a}$ to connect the bottom plates of all of the capacitors of the $C_{DAC1}$ to the $V_{inp}$, and to connect the upper ends of the $C_{DAC1}$ to the reference potential $V_{com}$. In addition, the switch control unit 15 controls the $SW_{pre1a}$ and $SW_{pre1b}$ to apply the reference voltage $V_{rp}$ of reversed polarity to the precharge capacitors $C_{pre1a}$ and $C_{pre1b}$ thereby performing precharge (FIG. 6A). When a non-inverting input end of operational amplifier is supposed to be a positive side, charge $Q_1$ accumulated at this time is given by the following expression.

[Mathematical Expression 2]

$$Q_1 = CV_{inp} + \frac{1}{2}CV_{rp} + \frac{1}{4}CV_{rp} + \frac{1}{8}CV_{rp} \tag{2}$$

When the sampling period ends, the switch control unit 15 opens the $SW_{1a}$ and controls the $SW_{DAC1}$, thereby connecting the bottom plates of the $C_{DAC1}$ to the $V_{com}$ and connecting the upper ends of the $C_{DAC1}$ to the input of the AMP 18. As a result of this, the potential of the $C_{DAC1}$ shifts by $-V_{inp}$, and charge of the $C_{DAC1}$ ($CV_{inp}$) is held.

Subsequently, the operation state of the first ADC 10*a* becomes the comparison phase (A/D conversion phase). The switch control unit 15 controls the $SW_{DAC1}$ to switch the connection of the bottom plate of the capacitor with the capacitance value of C/2 to either a reference voltage source $V_{rp}$ or the reference potential, and the comparator 14 successively compares the potential on the side of the upper ends of the $C_{DAC1}$ with the $V_{com}$. This operation is similar to the normal successive comparison A/D conversion shown in FIG. 3 and FIG. 4. If pieces of bit information obtained in the successive comparison phase are set to $D_2$ (most significant bit: MSB), $D_1$ and $D_o$ (least significant bit: LSB), respectively, each of the $D_2$, $D_1$ and $D_o$ takes a value of "0" or "1", and the obtained pieces of bit information are stored in the buffer inside the switch control unit 15.

The two precharge capacitors $C_{pre1a}$ $C_{pre1b}$ maintain a state in which the reference voltage $V_{rp}$ is accumulated therein during the successive comparison operation. After the successive comparison operation ends, the switch control unit 15 controls the $SW_{pre1a}$ and $SW_{pre1b}$ by using the pieces of bit information $D_2$ to $D_0$ obtained by the A/D conversion phase, thereby changing the charges accumulated in the precharge capacitors (FIG. 6B).

Figure 6B:
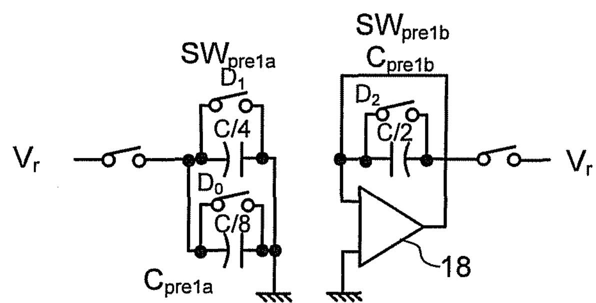
FIG. 6B is a diagram showing a state of calculation in the A/D conversion device shown in FIG. 5.

For instance, as shown in FIG. 6B, when the bit information $D_2$ is "0", the switch control unit 15 opens the $SW_{pre1b}$ so as to hold the charge accumulated in the $C_{pre1b}$ with the capacitance value of C/2 as it is. When the bit information $D_2$ is "1", the switch control unit 15 turns on the $SW_{pre1b}$ to short-circuit the both ends of the $C_{pre1b}$, so as to discharge the charge accumulated in the $C_{pre1b}$ with the capacitance value of C/2. The same applies to the pieces of bit information $D_1$, $D_0$ as well, and the switch control unit 15 controls the $SW_{pre1a}$ to control an amount of charge accumulated in the $C_{pre1a}$ formed of the capacitor with the capacitance value of C/8 and the capacitor with the capacitance value of C/4.

As a result of this, charge $Q_1$' accumulated in the first ADC 10 is represented by the following expression.

[Mathematical Expression 3]

$$Q_1' = -CV_{inp} + \frac{1}{2}CV_{rp}D_2 + \frac{1}{4}CV_{rp}D_1 + \frac{1}{8}CV_{rp}D_0 \quad (3)$$

Figure 6C:
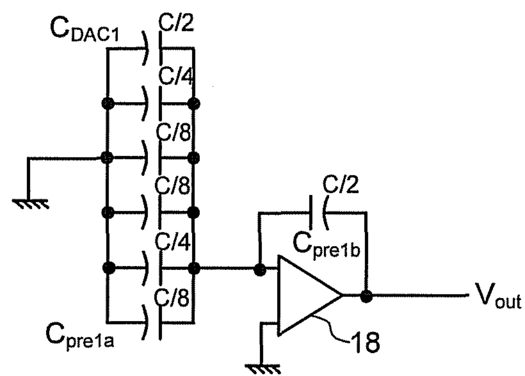
FIG. 6C is a diagram showing a basic calculation phase in the A/D conversion device shown in FIG. 5.

Subsequently, the switch control unit 15 controls the $SW_{DAC1}$ to connect the bottom plates of the $C_{DAC1}$ and the bottom plates of the $C_{pre1a}$ to the reference potential $V_{com}$, and connects the upper ends of the respective $C_{DAC1}$ and $C_{pre1a}$ to the input of the AMP 18. In addition, the switch control unit 15 controls the $SW_{pre1b}$ to connect the both ends of the $C_{pre1b}$ to input and output ends of the AMP 18 (FIG. 6C). Accordingly, the operation state of the first ADC 10*a* becomes the basic calculation phase. At this time, when an input end of amplifier is supposed to be a positive side, charge $Q_2$ accumulated in the $C_{pre1b}$ connected to the input and output ends of the AMP 18 is represented by the following expression.

[Mathematical Expression 4]

$$Q_2 = \frac{1}{2}CV_{op} \quad (4)$$

If it is set that a period of time from the sample phase of the capacitive DAC to the basic calculation phase based on the switch control of the switch control unit 15 is a very short period of time, and there is no path in which the accumulated charge is reduced, $Q_1$' can be regarded to be equal to $Q_2$. In that case, as a result of the basic calculation, a voltage value $V_{op}$, to be sent to the ADC of the subsequent stage is represented by the following expression.

[Mathematical Expression 5]

$$V_{op} = -2V_{inp} + D_2V_{rp} + \frac{1}{2}D_1V_{rp} + \frac{1}{4}D_0V_{rp} \quad (5)$$

Figure 5:
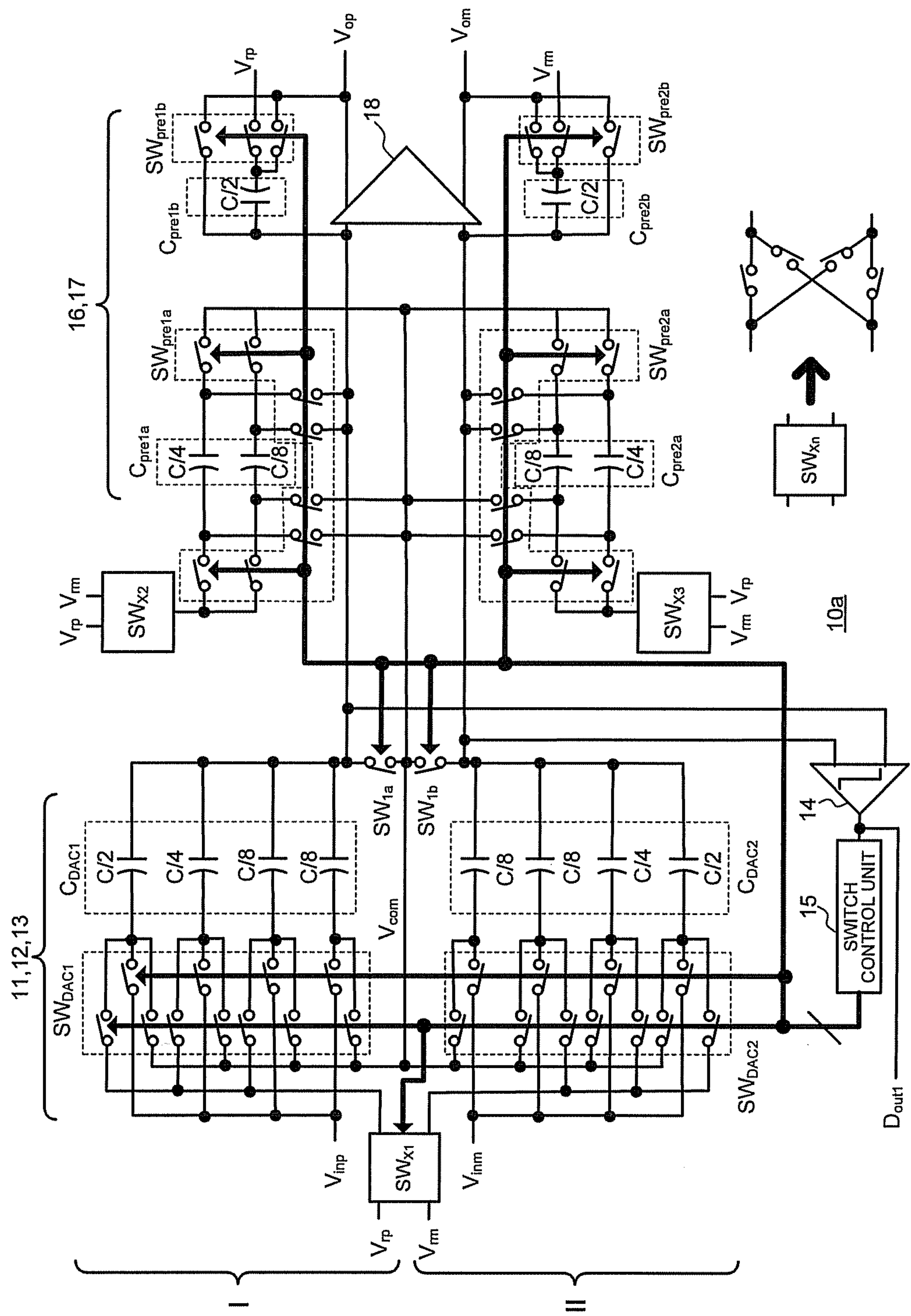
FIG. 5 is a diagram showing an example of the A/D conversion device of the first embodiment.

As above, the basic calculation can be realized also by the first ADC 10*a* (SARADC) shown in FIG. 5. Particularly, the SARADC shown in FIG. 5 does not use an external reference voltage at all in the basic calculation phase, and realizes the basic calculation by using the potential charged in the precharge capacitors $C_{pre1a}$ and $C_{pre1b}$. This means that, if the accumulation of charge of the reference voltage is conducted in the sample phase and the successive comparison phase, the supply of reference voltage in the basic calculation can be omitted, resulting in that it becomes possible to suppress power consumption of a reference voltage driving buffer.

Further, the example shown in FIG. 5 is structured such that an output amplitude becomes half of an input full scale of the circuit. By adopting such a structure, it becomes possible that a feedback capacitance connected to the AMP 18 is shared with the precharge capacitors, resulting in that a reduction in area of the circuit can be realized. Note that if the precharge capacitors are structured to include a capacitor of C/2 in addition to the capacitors of C/8 and C/4, it is also possible to structure a circuit in which the output amplitude becomes equivalent to the input full scale.

Example 2

Figure 7:
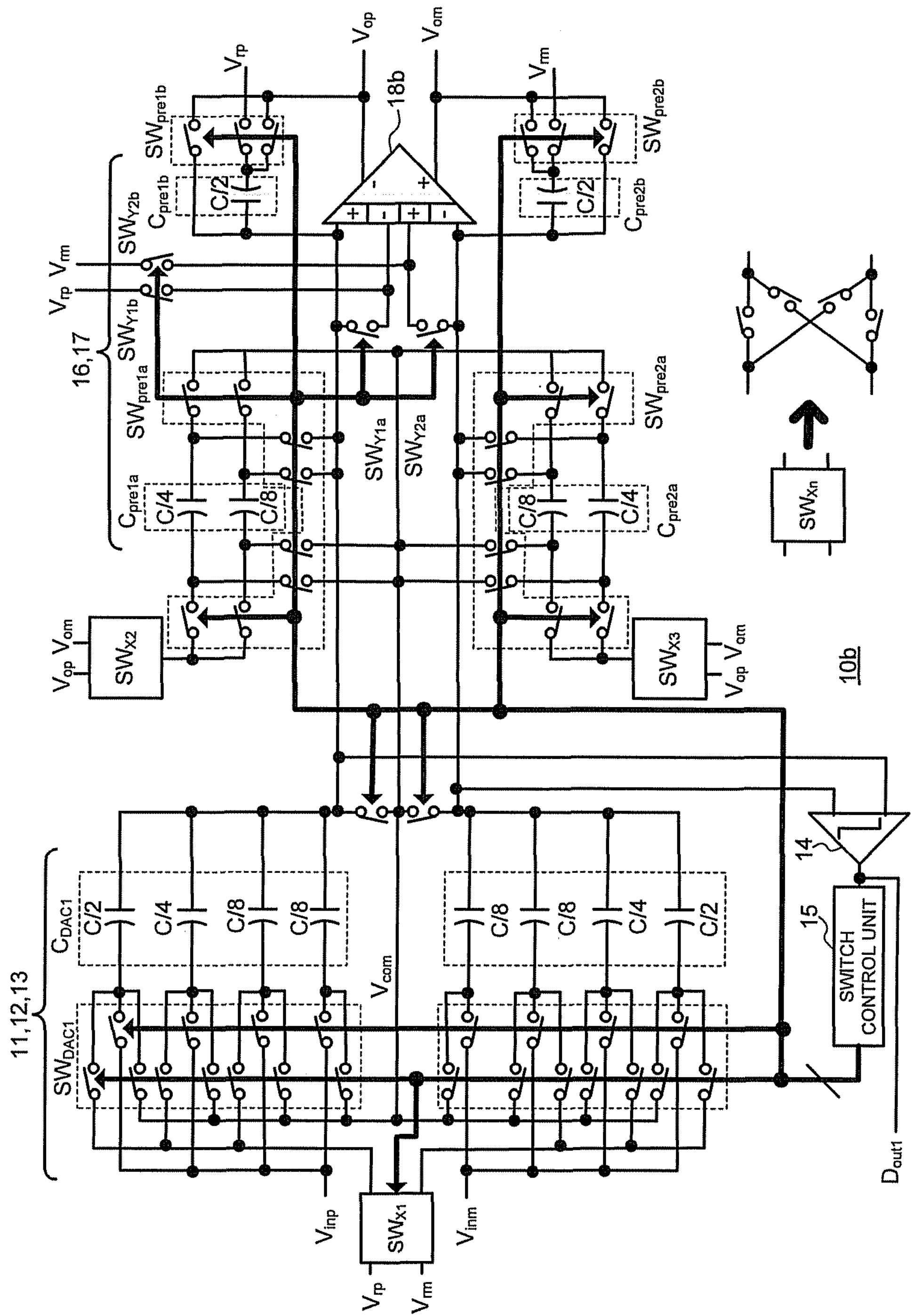
FIG. 7 is a diagram showing another example of the A/D conversion device of the first embodiment.

Next, with reference to FIG. 7, another example of the ADC 1 of this embodiment will be described. When compared with the example shown in FIG. 5, a first ADC 10*b* in this example has a dual input amplifier 18*b* instead of the AMP 18, and further includes switches $SW_{Y1a}$, $SW_{Y2a}$, $SW_{Y1b}$ and $SW_{Y2b}$ which play roles of short-circuiting mutual input ends and supplying the reference voltage ($V_{rp}$ or $V_{rm}$). Specifically, the SARADC according to this embodiment can also be applied to a case where the dual input amplifier is used.

Second Embodiment

Next, an ADC of a second embodiment will be described with reference to FIG. 8. When compared with the first ADC 10 in the first embodiment, an ADC 2 of this embodiment further includes a $SW_3$ switching an input of an AMP, and a $SW_4$ short-circuiting the input and an output of the AMP. For this reason, elements common to those of the ADC 1 of the first embodiment are denoted by the common reference numerals, and overlapped explanation will be omitted.

Figure 8:
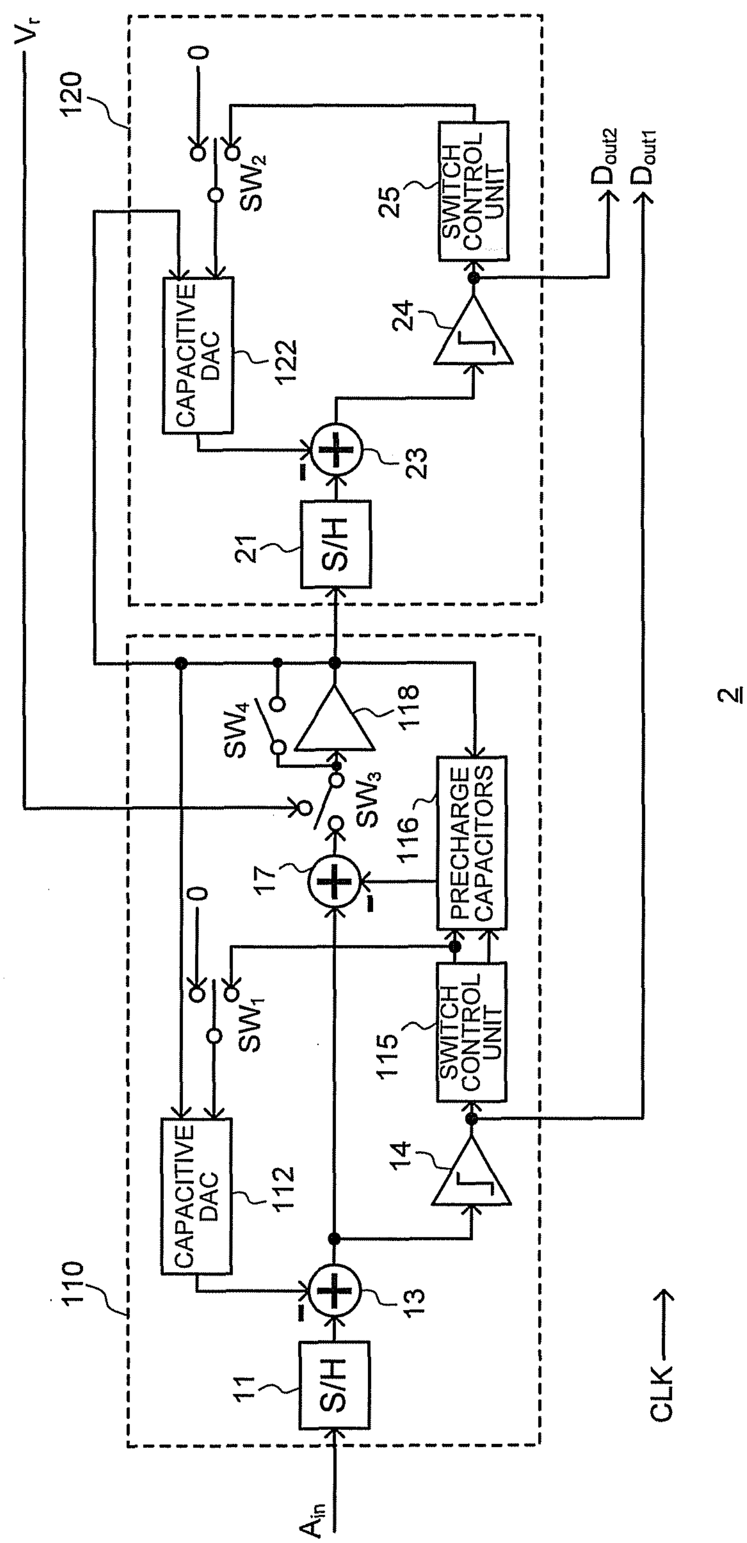
FIG. 8 is a diagram showing an A/D conversion device according to a second embodiment.

As shown in FIG. 8, to an input of an AMP 118 corresponding to the AMP 18 of the first embodiment, the $SW_3$ is connected. The $SW_3$ inputs either an output of the subtracter 17 or the reference voltage source $V_r$ to the AMP 118. An output of the AMP 118 is connected to a capacitive DAC 112, a capacitive DAC 122, precharge capacitors 116 and the S/H 21 of the subsequent stage. The switch control unit 15 further controls the $SW_3$ to switch an input source of the AMP 118. Further, the $SW_4$ is connected between the input and the output of the AMP 118. Specifically, as shown in FIG. 8, the capacitive DAC 122 of a second ADC 120 obtains the reference voltage $V_r$ from the output of the AMP 118.

Figure 9:
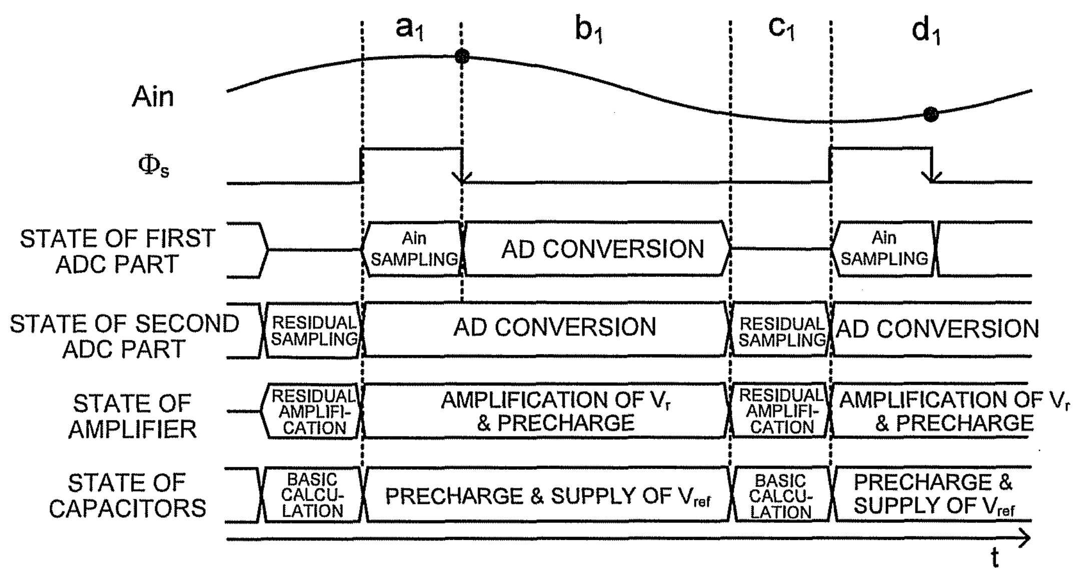
FIG. 9 is a diagram showing an operation of the A/D conversion device of the second embodiment.

The ADC 2 of this embodiment is different from the ADC 1 of the first embodiment in that the reference voltage $V_r$ is amplified in the AMP 118 to charge the precharge capacitors. As is understood from the timing chart shown in FIG. 2, in the pipelined SARADC shown in FIG. 1, the amplifier used for the basic calculation (residual amplification) is not used in each phase of the sample phase and the successive comparison A/D conversion phase. As shown in FIG. 9, in the ADC 2 of the second embodiment, the amplifier is functioned as a buffer for precharging reference voltage during the interval of the phases ($a_1$ to $b_1$).

Specifically, when the operation states of the first ADC 110 are the sample phase, the hold phase and the A/D conversion phase, the switch control unit 115 controls the $SW_3$ and $SW_4$ to input the reference voltage $V_r$ into the AMP 118, thereby amplifying the reference voltage $V_r$.

As shown in FIG. 8, the output of the amplifier 118 is connected to the capacitive DAC 112, the capacitive DAC 122 and the precharge capacitors 116, so that in the sample phase, the hold phase and the A/D conversion phase, the AMP 118 amplifies the reference voltage $V_r$ to charge the precharge capacitors, and supplies the reference voltage $V_r$ to the capacitive DAC 112 and the capacitive DAC 122. Further, when the operation state of the first ADC 110 is the residual amplification phase, the switch control unit 115 controls the $SW_3$ to amplify a difference between an input signal and a comparison signal (perform basic calculation), and sends the resultant to the second ADC 120 of the subsequent stage.

According to the ADC 2 of the second embodiment, a special operational amplifier for the reference voltage buffer is not required, and further, the reference voltage may also be small, which results in enabling low power consumption and reduction in area.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An A/D convertor, comprising:

a first D/A conversion unit configured to sample an analog input signal, and to generate a first difference signal by performing successive comparison of the analog input signal based on a reference voltage;

a precharge capacitor unit configured to accumulate a charge for the reference voltage;

a first comparing unit configured to compare the first difference signal with a reference value to generate a first digital signal; and an amplifying unit configured to generate a residual signal by a calculation using the first difference signal and the reference voltage.

2. The A/D convertor according to claim 1, wherein the first D/A conversion unit comprises:

a comparison voltage generating unit configured to generate a comparison voltage for successive comparison with the analog input signal by using the reference voltage; and a difference signal generating unit configured to generate the first difference signal from a difference between the analog input signal and the comparison voltage.

3. The A/D convertor according to claim 1, wherein the first D/A conversion unit comprises:

a first capacitor section formed of a plurality of capacitors whose respective one ends are mutually connected; and a first switch configured to give anyone of the analog input signal, the reference voltage and the reference value to each of the other ends of the plurality of capacitors that form the first capacitor section.

4. The A/D convertor according to claim 3, wherein the first capacitor section has a plurality of capacitors each having a binary-weighted different capacitance value.

5. The A/D convertor according to claim 1, wherein the pre charge capacitor unit comprises:

a second capacitor section formed of a plurality of capacitors holding the reference voltage;

a second switch configured to control a supply of the reference voltage with respect to the second capacitor section; and a third switch configured to short-circuit the plurality of capacitors of the second capacitor section based on the digital signal.

6. The A/D convertor according to claim 5, wherein the second capacitor section has a plurality of capacitors each having a binary-weighted different capacitance value.

7. The A/D convertor according to claim 5, wherein the second capacitor section holds the reference voltage during a period of time from when the first D/A conversion unit samples the analog input signal to when the first D/A conversion unit generates the first difference signal.

8. The A/D convertor according to claim 1, further comprising a fourth switch giving either the first difference signal or the reference voltage to the amplifying unit, wherein the amplifying unit amplifies the reference voltage and gives the resultant to the first D/A conversion unit during a period of time in which the first D/A conversion unit generates the comparison voltage.

9. The A/D convertor according to claim 1, further comprising:

a second D/A conversion unit configured to sample the residual signal, and to generate a second difference signal by performing successive comparison of the residual signal based on the reference voltage; and a second comparing unit configured to compare the second difference signal with the reference value to generate a second digital signal.

10. A radio device, comprising:

a high-frequency amplifier configured to amplify a reception signal received from an antenna;

a frequency convertor configured to convert the reception signal into a baseband signal; and the A/D convertor according to claim 1 to perform A/D conversion on the baseband signal.

* * * * *